(12) United States Patent
Ishii et al.

(10) Patent No.: US 6,524,769 B1
(45) Date of Patent: Feb. 25, 2003

(54) PHOTOSENSITIVE RESIN

(75) Inventors: Kenji Ishii, Tokyo (JP); Isao Hagiwara, Tokyo (JP); Toru Harada, Tokyo (JP); Makoto Miyamoto, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 117 days.

(21) Appl. No.: 09/633,099

(22) Filed: Aug. 4, 2000

(30) Foreign Application Priority Data

Aug. 9, 1999 (JP) ............................................. 11-225193

(51) Int. Cl.$^7$ .......................... G03F 7/038; C07C 69/54
(52) U.S. Cl. .................. 430/280.1; 522/100; 528/100; 528/112; 525/531; 525/536
(58) Field of Search ................... 430/280.1; 522/100; 528/100, 112; 525/531, 536

(56) References Cited

U.S. PATENT DOCUMENTS

| | | | | |
|---|---|---|---|---|
| 4,393,195 A | * | 7/1983 | Gaku et al. .................. | 528/361 |
| 4,533,727 A | | 8/1985 | Gaku et al. .................. | 528/361 |
| 4,554,346 A | * | 11/1985 | Gaku et al. .................. | 528/363 |
| 4,820,855 A | | 4/1989 | Gaku et al. .................. | 558/167 |
| 5,605,781 A | * | 2/1997 | Gelorme et al. ......... | 430/280.1 |

FOREIGN PATENT DOCUMENTS

| | | | |
|---|---|---|---|
| EP | 0 292 219 | | 11/1988 |
| EP | 0 548 970 | | 6/1993 |
| EP | 1035440-a1 | * | 9/2000 |

* cited by examiner

Primary Examiner—Cynthia Hamilton
(74) Attorney, Agent, or Firm—Wenderoth, Lind & Ponack, L.L.P.

(57) ABSTRACT

A photosensitive resin obtained by reacting a reaction product (I) prepared from a biphenyl epoxy acrylate (a) of the formula (1) and a cyanate ester compound (b) with a polybasic acid anhydride (c), and a photosensitive resin and an epoxy compound,

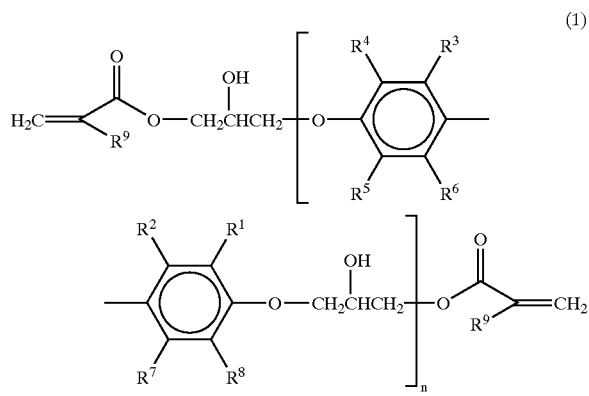

(1)

wherein each of $R^1$ and $R^9$ is a hydrogen atom or methyl, and n is an integer of 1 or more. The photosensitive resin and the photosensitive resin composition have excellent developability, has high heat resistance and particularly has excellent heat resistance and reliability on electric insulation under moisture absorption lasting for a long period of time.

8 Claims, No Drawings

PHOTOSENSITIVE RESIN

BACKGROUND OF THE INVENTION

1. Field of the Invention

The present invention relates to a photosensitive resin composition for use as a material for a printed wiring board. More specifically, it relates to a photosensitive resin composition which has excellent resolution and high heat resistance and which gives, as a material, a printed wiring board excellent in heat resistance and electric insulation under moisture absorption taking place for a long period of time.

2. Prior Art of the Invention

In recent years, electronic machines and equipment are desired to have a decreased size and an increased density, and printed wiring boards are also essentially required to have a smaller size, a higher density, a lighter weight and a smaller thickness. For applying a solder resist material onto a substrate, it is so far general practice to use solder resist material which is curable with ultraviolet light, developable with a diluted alkali and excellent in durability against plating and a solvent. However, in build-up boards having fine wirings inside, and the like, solder resists recently cause a popcorn phenomenon in a solder resist/sealing resin interface, or some other problems. That is, the solder resists cause problems with regard to heat resistance. Further, solder resists are also required to have reliability on insulation between fine wiring lines.

For improving electric insulation and heat resistance, there has been developed a resist utilizing a cyanate ester compound such as a BT resin (Japanese Patent Application No. 8-298641). In development with an alkali, the cyanate ester compound causes a remaining resin after the development, which causes a problem in the steps of electroless plating with nickel and electroless plating with gold. With regard to this problem, it is already known that when a cyanate ester compound such as a BT resin, etc., and an epoxy acrylate are allowed to react with each other in advance for improving developability, electric properties and the developability are improved at the same time (Japanese patent Application No. 11-61075).

The above resist is excellent in resist properties. However, it has been found that the above resist has a problem on durability against heat under long-lasting moisture absorption. When a resist is used for the production of semiconductor packages, the resist is required to have durability against heat under long-lasting moisture absorption, and such durability against heat comes to be of great interest.

SUMMARY OF THE INVENTION

Under the circumstances, it is an object of the present invention to provide a photosensitive resin composition which is highly heat-resistant, which is excellent in durability against heat and electric insulation reliability under long-lasting moisture absorption, and which is developable with an alkali.

According to the present invention, there is provided a photosensitive resin (II) which is a reaction product formed by reacting a reaction product (I) prepared from a biphenyl epoxy acrylate (a) of the formula (1) and a cyanate ester compound (b) with a polybasic acid anhydride

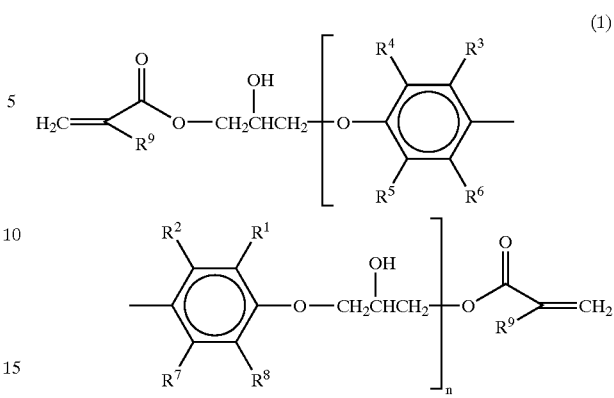

(1)

wherein each of $R^1$ and $R^9$ is a hydrogen atom or methyl, and n is an integer of 1 or more.

According to the present invention, there is provided a photosensitive resin composition comprising the above photosensitive resin (II) and an epoxy resin (d).

DETAILED DESCRIPTION OF THE INVENTION

The present inventors have made diligent studies for achieving the above objects. As a result, it has been found that the above objects can be achieved by using a resin obtained by reacting a difunctional epoxy acrylate having a biphenyl skeleton with a cyanate ester compound and reacting the resultant reaction product with a polybasic acid anhydride, and the present invention has been accordingly completed.

That is, the present invention provides a photosensitive resin (II) obtained by reacting a reaction product (I) prepared from a biphenyl epoxy acrylate (a) of the above formula (1) and a cyanate ester compound (b) with a polybasic acid anhydride (c). It is preferred to use an epoxy acrylate (a) of the formula (1) in which, of $R^1$ to $R^8$, each of $R^2$, $R^3$, $R^6$ and $R^7$ is a hydrogen atom and the others are methyl or an epoxy acrylate (a) of the formula (1) in which, of $R^1$ to $R^8$, each of $R^3$ and $R^7$ is a hydrogen atom and the others are methyl.

The present invention also provides a photosensitive resin composition (III) comprising the above photosensitive resin (II) and an epoxy resin (d).

The cyanate ester compound (b) used in the present invention refers to an aromatic organic compound generally having at least 2 but not more than 5 cyanato groups (—O—C≡N) per molecule, and the cyanate groups bond directly to an aromatic ring of the aromatic group R.

Specific examples of the cyanate ester compound (b) include 1,3- or 1,4-cyanatebenzene, 1,3,5-tricyanatebenzene, 1,3-, 1,4-, 1,6-, 1,8-, 2,6- or 2,7-cyanatenaphthalene, 1,3,6-tricyanatenaphthalene, 4,4'-dicyanatebiphenyl, bis(4-cyanatephenyl)methane, 2,2-bsi(4-cyanatephenyl)propane, 2,2-bsi(3,5-dibromo-4-cyanatephenyl)propane, bis(4-cycanatephenyl)ether, bis(4-cyanatephenyl)thioether, bis(4-cyanatephenyl)sulfone, tris(4-cyanatephenyl)phosphite, tris(4-cyanatephenyl)phosphate and cyanates obtained by reactions of novolak and cyan halides.

In addition to these, the cyanate ester compound (b) can be also selected from polyfunctional cyanate ester compounds described in Japanese Patent Publications Nos. 41-1928, 43-18468, 44-4791, 45-11712, 46-1112, 47-26853 and 51-63149. These cyanate ester compounds may be used alone or in combination. The content of impurities such as hydrolyzing Cl and Na in these compounds is very small, and when any one of these is incorporated as one component in the present invention, the overall content of impurities decreases, so that the photosensitive resin (II) is suitable as a peripheral material for semiconductors.

Further, there may be used triazine-ring-possessing prepolymers having a molecular weight of 200 to 6,000 formed by trimerization of cyanate groups of the above polyfunctional cyanate ester compounds. The prepolymers can be obtained by polymerizing the above polyfunctional cyanate ester compound monomers in the presence of a catalyst selected from acids such as mineral acids and Lewis acids, bases such as sodium alcoholate and tertiary amines or salts such as sodium carbonate. The prepolymers partially contain monomers and have the form of a mixture of a monomer and a polymer, and these materials are preferably used in the present invention.

The polybasic acid anhydride (c) for use in the present invention refers to an acid anhydride having at least 2 carboxylic acids per molecule. Examples of the polybasic acid anhydride (c) include phthalic acid anhydride, trimellitic acid anhydride, pyromellitic acid anhydride, naphthalene-1,4,5,8-tetracarboxylic acid dianhydride, benzophenonetetracarboxylic acid anhydride, tetrahydrophthalic acid anhydride, hexahydrophthalic acid anhydride, 4-methylhexahydrophthalic acid anhydride, 3-methylhexahydrophthalic acid anhydride, succinic acid anhydride, dodecenylsuccinic acid anhydride, ethylene glycol bias(anhydrotrimellitate), 3,3',4,4'-diphenylsulfonetetracarboxylic acid dianhydride, 4,4'-oxydiphthalic acid anhydride, 4,4'-diphthalic acid anhydride, and others having molecules containing acid anhydrides. These may be used alone or in combination. A mixture containing pyromellitic acid anhydride is preferred.

The method of practicing the present invention will be explained below.

First, when the epoxy acrylate (a) having a biphenyl skeleton is reacted with the cayante ester compound (b), generally, 5 to 40 part o the cyanate ester compound (b) can be modified per 100 parts of the epoxy acrylate (a), although the amount ratio is not specially limited. When the amount of the cyanate ester compound (b) is small, the heat resistance, the moisture absorption and the electric insulation after a pressure cooker test are insufficient. When the amount of the cyanate ester compound (b) is large, there is caused a problem during the production of a resin, such as gelation during the synthesis of a resin. The amount of the cyanate ester compound (b) is therefore preferably 5 to 30 parts. The reaction temperature is 50 to 100° C., and the reaction time period is 5 to 100 hours. A solvent may be used for adjusting a viscosity during the reaction. Although not specially limited, the solvent is preferably selected from those having such a boiling point that almost all of it can be evaporated during the drying of a layer of a photosensitive resin composition. Examples of the solvent include ketones such as acetone and methyl ethyl ketone, esters such as dipropylene glycol monomethyl ether acetate, dipropylene glycol monomethyl ether, diethyl ether monomethyl ether acetate and diethyl ether monomethyl ether, and aromatic hydrocarbons such as solvent naphtha, toluene, xylene and ethylbenzene. These solvents may be used alone or in combination.

Then, the resin is modified with a carboxylic acid to render the resin developable with an alkali.

The modification amount is 10 to 90 parts per 100 parts of the epoxy acrylate (a), and there is obtained a resin having a resin acid value of 40 to 400 mgKOH/g. An acid value of approximately 50 to 120 is effective in view of developability, and it is required to add a polybasic acid anhydride in such an amount that the acid value is brought into the above range. In this case, a solvent may be also used for adjusting a viscosity, and the solvent can be selected from the above-described solvents.

The use of the photosensitive resin (II) in the photosensitive resin composition (III) will be explained below. For use as a resist ink, an epoxy resin (d) for improving various properties such as adhesion, heat resistance and soldering durability and a photopolymerization initiator for initiation of polymerization are required in addition to the photosensitive resin (II).

Examples of the epoxy resin (d) used in the present invention include a bisphenol A type epoxy resin, a bisphenol F type epoxy resin, a biphenyl type epoxy resin, a novolak type epoxy resin, triglycidyl isocyanurate and an alicyclic epoxy resin. These epoxy resins are used alone or in combination. Of these, triglycidyl isocyanurate is preferred since a dark reaction takes slowly during the drying of a resist ink.

The amount of the epoxy resin (d) is required to be equivalent to, or greater than, the equivalent weight of carboxylic acids contained in the photosensitive resin, and it is preferably 1 to 1.5 equivalent weights. Further, the amount of the epoxy resin (d) based on the composition is preferably 50 parts or less, particularly preferably 3 to 45 parts.

The photopolymerization initiator used in the present invention is selected from known photopolymerization initiators. Examples of the photopolymerization initiator include α-diketones such as benzyl and diacetyl, acyloin ether, thioxanthones such as thioxanthone and 2,4-diethylthioxanthone, benzophenones such as benzophenone and 4,4'-bis(dimethylamino)benzophenone, acetophenones such as acetophenone, 2,2'-dimethoxy-2-phenylacetophenone and β-methoxyacetophenone, quinines such as anthraquinone and 1,4-naphthoquinone, and peroxides such as di-tert-butylperoxide. These photopolymerization initiators may be used alone or in combination. The amount of the photopolymerization initiator is 0.1 to parts by weight, preferably 0.2 to 10% by weight.

The above components are kneaded by a generally known method in which dispersing can be carried out homogeneously with a three-roll mill, a homogenizer or a bead mill. Further, the photosensitive resin composition (III) may contain known additives such as a filler, a curing promoter, an anti-foamer, a surface-treating agent, a flame retardant, a pigment and a dye. The filler includes silicas such as natural silica, fused silica and amorphous silica, white carbon, titanium white, aerosil, alumina, talc, natural mica, synthetic mica, kaolin, clay, aluminum hydroxide, magnesium hydroxide, zinc molybdate, barium sulfate, E-glass, A-glass, C-glass, L-glass, D-glass, S-glass, M-glass and G20-glass. The curing promoter includes imidazoles such as 2-methylimidazole, 2-ethyl-4-methylimidazole, 2-undecylimidazole, 2-heptadecylimidazole, 2-phenylimidazole and 1-benzyl-2-methylimidazole, tertiary amines such as benzyldimethylamine and phosphorus compounds such as phosphine compounds and phosphonium compounds.

A resist ink preferably prepared such that the content of the photosensitive resin (II) as a main component, based on the total amount, of 30 to 90% by weight. When the resin content is less than % by weight, it is difficult to secure the formation of a resin layer having a uniform thickness, and the resist ink is not suitable for use in printed wiring boards since the layer is unstable in quality. When the resin content exceeds 90% by weight, a layer formed of the resist ink on a printed wiring board may peeled off, or the printed wiring board may vary in electric characteristics.

The photosensitive resin composition (III) of the present invention is useful as a resist ink of an etching resist and permanent resists such as a solder resist and an insulating resist for a build-up printed wiring board. Further, it can be used as a coating composition, a coating agent or an adhesive. The photosensitive resin composition (III) of the present invention is cured, for example, by the following method, to give a cured product.

That is, the photosensitive resin composition of the present invention is applied to a printed wiring board by a screen printing method, a spray method, a roll coating method, an electrostatic painting method or a curtain coating method, to form a coating having a thickness of to 160 μm, the coating is dried at 60 to 110° C. and then exposed to ultraviolet light through a negative film, an unexposed portion is developed with a diluted alkali aqueous solution, and the coating was further fully cured by irradiation with ultraviolet light or heating for improving its properties, whereby a cured coating is obtained.

The light source for applying active energy for curing the photosensitive resin composition (III) of the present invention includes a low-pressure mercury lamp, an intermediate-pressure mercury lamp, a high-pressure mercury lamp, an ultrahigh-pressure mercury lamp, a xenon lamp and a metal halide lamp. The dose is 100 to 2,000 mJ/cm$^2$, preferably 250 to 1,000 mJ/cm$^2$. When the dose is small, an exposed portion is not cured, and is dissolved during development.

After the photosensitive resin composition (III) of the present invention is exposed to the above light, development can be carried out by a known method such as a spray development method in which a developer solution is applied by spraying or a dipping development method in which a printed wiring board is dipped in a developer solution and vibrated. The temperature of the developer solution is 5 to 50° C., preferably 25 to 40° C. When the temperature of the developer solution is low, there is caused a problem that development takes a time and that developing performance is poor. When the above temperature is high, a portion cured by exposure comes to be dissolved. The developer solution can be selected from known diluted alkali aqueous solutions such as a sodium hydroxide aqueous solution and an ammonium hydroxide aqueous solution. The content of an alkali agent in the aqueous solution is preferably 0.1 to 5.0% by weight.

When the photosensitive resin composition (III) of the present invention is cured by heating after the development, the curing temperature is 100 to 250° C., preferably 120 to 200° C. When the curing temperature is low, the curing takes a time. When the curing temperature is high, there is caused a problem of discoloration or partial swelling.

EXAMPLES

The present invention will be specifically explained with reference to Examples and Comparative Examples hereinafter, while the present invention shall not be limited thereto. In Examples and Comparative Examples, "part" stands for "parts by weight" and "%" stands for "% by weight".

Synthesis Example 1

100 Parts of 2,2',6,6'-tetramethylbiphenol-epoxy acrylate, 5 parts of a bisphenol A type cyanate ester compound (BT2070) and 105 parts of dipropylene glycol monomethyl ether acetate/solvent naphtha (50/50) as a solvent were mixed, to prepare a mixture having a solid content of 50%. The mixture was mechanically stirred under heat at 70° C. while tracing a cyanate peak (around 2,300 cm$^{-1}$) through infrared absorption spectrum. After 5.5 hours, the cyanate peak disappeared, which was taken as an end point of the reaction.

To the reaction mixture were added 22 parts of pyromellitic acid anhydride (corresponding to 50% of the molar amount of the epoxy acrylate) and 22 parts of the above solvent, and the mixture was mechanically stirred at a reaction temperature of 70° C. while tracing a carboxylic acid anhydride peak (around 1,850 cm$^{-1}$) through infrared absorption spectrum. After 6 hours, the peak disappeared, which was taken as an end point of the reaction. This resin had a carboxylic acid value of 95 mgKOH/g (to be referred to as "resin a" hereinafter).

Synthesis Example 2

A resin was prepared in the same manner as in Synthesis Example 1 except that 10 parts of a bisphenol A type cyanate ester compound (BT2070) and 17.5 parts of pyromellitic acid anhydride (corresponding to 40% of the molar amount of the epoxy acrylate) were used. This resin had a carboxylic acid value of 78 mgKOH/g (to be referred to as "resin b" hereinafter).

Synthesis Example 3

A resin was prepared in the same manner as in Synthesis Example 1 except that parts of a bisphenol A type cyanate ester compound (BT2070) and 13 parts of pyromellitic acid anhydride (corresponding to 30% of the molar amount of the epoxy acrylate) were used. This resin had a carboxylic acid value of 56 mgKOH/g (to be referred to as "resin c" hereinafter).

Synthesis Example 4

A resin was prepared in the same manner as in Synthesis Example 1 except that 30 parts of a bisphenol A type cyanate ester compound (BT2070) was used and that the pyromellitic acid anhydride was replaced with 49 parts of tetrahydrophthalic acid anhydride (corresponding to 160% of the molar amount of the epoxy acrylate). This resin had a carboxylic acid value of 98 mgKOH/g (to be referred to as "resin d" hereinafter).

Synthesis Example 5

100 Parts of 2,2',3,3',6,6'-hexamethylbiphenol-epoxy acrylate, 5 parts of a bisphenol A type cyanate ester compound (BT2070) and 105 parts of dipropylene glycol monomethyl ether acetate/solvent naphtha (50/50) as a solvent were mixed, to prepare a mixture having a solid content of 50%. The mixture was mechanically stirred under heat at 70° C. while tracing a cyanate peak (around 2,300 cm$^{-1}$) through infrared absorption spectrum. After 5.5 hours, the cyanate peak disappeared, which was taken as an end point of the reaction.

To the reaction mixture were added 20.6 parts of pyromellitic acid anhydride (corresponding to 50% of the molar amount of the epoxy acrylate) and 20.6 parts of the above solvent, and the mixture was mechanically stirred at a reaction temperature of 70° C. while tracing a carboxylic acid anhydride peak (around 1,850 cm$^{-1}$) through infrared absorption spectrum. After 6 hours, the peak disappeared, which was taken as an end point of the reaction. This resin had a carboxylic acid value of 97 mgKOH/g (to be referred to as "resin e" hereinafter).

Synthesis Example 6

A resin was prepared in the same manner as in Synthesis Example 5 except that parts of a bisphenol A type cyanate ester compound (BT2070) and 16.5 parts of pyromellitic acid anhydride (corresponding to 40% of the molar amount of the epoxy acrylate) were used. This resin had a carboxylic acid value of 77 mgKOH/g (to be referred to as "resin f" hereinafter).

Synthesis Example 7

A resin was prepared in the same manner as in Synthesis Example 5 except that 15 parts of a bisphenol A type cyanate ester compound (BT2070) and 12.4 parts of pyromellitic acid anhydride (corresponding to 30% of the molar amount of the epoxy acrylate) were used. This resin had a carboxylic acid value of 57 mgKOH/g (to be referred to as "resin g" hereinafter).

Synthesis Example 8

A resin was prepared in the same manner as in Synthesis Example 5 except that 30 parts of a bisphenol A type cyanate ester compound (BT2070) was used and that the pyromellitic acid anhydride was replaced with 46 parts of tetrahydrophthalic acid anhydride (corresponding to 160% of the molar amount of the epoxy acrylate). This resin had a carboxylic acid value of 99 mgKOH/g (to be referred to as "resin h" hereinafter).

Comparative Synthesis Example 1

100 Parts of novolak type epoxy acrylate (epoxy equivalent before acryl modification 270 g/eq), 33.8 parts of tetrahydrophthalic acid anhydride (corresponding to 60% of the molar amount of epoxy acrylate hydroxyl groups) and 133.8 parts of dipropylene glycol monomethyl ether acetate/solvent naphtha (50/50) as a solvent were mixed, to prepare a mixture having a solid content of 50%.

The mixture was mechanically stirred under heat at 70° C. while tracing a carboxylic acid anhydride peak (around 1,850 cm$^{-1}$) through infrared absorption spectrum. After 8 hours, the peak disappeared, which was taken as an end point of the reaction. This resin had a carboxylic acid value of 93 mgKOH/g (to be referred to as "resin i" hereinafter).

Comparative Synthesis Example 2

100 Parts of 2,2',6,6'-tetramethylbiphenol-epoxy acrylate, 26.3 parts of pyromellitic acid anhydride (corresponding to 60% of the molar amount of epoxy acrylate hydroxyl groups) and 126.3 parts of dipropylene glycol monomethyl ether acetate/solvent naphtha (50/50) as a solvent were mixed, to prepare a mixture having a solid content of 50%.

The mixture was mechanically stirred under heat at 70° C. while tracing a carboxylic acid anhydride peak (around 1,850 cm$^{-1}$) through infrared absorption spectrum. After 8 hours, the peak disappeared, which was taken as an end point of the reaction. This resin had a carboxylic acid value of 112 mgKOH/g (to be referred to as "resin j" hereinafter).

Comparative Synthesis Example 3

100 Parts of bisphenol A type epoxy acrylate, 27.0 parts of pyromellitic acid anhydride (corresponding to 60% of the molar amount of epoxy acrylate hydroxyl groups) and 127 parts of dipropylene glycol monomethyl ether acetate/solvent naphtha (50/50) as a solvent were mixed, to prepare a mixture having a solid content of 50%.

The mixture was mechanically stirred under heat at 70° C. while tracing a carboxylic acid anhydride peak (around 1,850 cm$^{-1}$) through infrared absorption spectrum. After 8 hours, the peak disappeared, which was taken as an end point of the reaction. This resin had a carboxylic acid value of 116 mgKOH/g (to be referred to as "resin k" hereinafter).

Comparative Synthesis Example 4

A resin was prepared in the same manner as in Synthesis Example 5 except that 100 parts of bisphenol A type epoxy acrylate, 5 parts of a bisphenol A type cyanate ester compound (BT2070) and 22.5 parts of pyromellitic acid anhydride (corresponding to 50% of the molar amount of the epoxy acrylate) were used.

This resin had a carboxylic acid value of 92 mgKOH/g (to be referred to as "resin l" hereinafter).

Examples 1–8

50 Parts of one of the resins a to h, 15 parts of triglycidyl isocyanurate (TGIC), 5 parts of Irgacure (photopolymerization initiator, IRC-651, supplied by Ciba Geigy), 1 part of each of BYK 357 and BYK 054 (antifoamer and a surface smoothing agent, supplied by BYK Chemie), 1 part of Phthalocyanine Green (FCG, supplied by Sanyo Shikiso), 20 parts of talc and 10 parts of barium sulfate were mixed, the mixture was kneaded with a three-roll mill (supplied by Aimex), and the resultant composition was applied onto a mechanically surface-polished copper-clad laminate board with a screen printing machine (LS15GX, supplied by Newlong Seimitsu Kogyo), to form a coating having a thickness of 40 µm.

The thus-prepared board was placed in a dryer at 70° C. for 30 mintues, and after it was found that the board had no tackiness, the board was exposed with a parallel ray exposure machine with an exposure pattern thereon at a dose of 500 mJ/cm$^2$. The exposed board was developed under a spray pressure of 1.5 kg/cm$^2$ with a 1% sodium carbonate aqueous solution for 60 seconds, followed by washing with water. Then, the board was placed in a hot air dryer at 160° C. for 1 hour to cure the composition under heat.

The thus-obtained test piece with a cured coating thereon was measured or evaluated for a Tg, adhesion, durability against soldering heat, durability against soldering heat after moisture absorption, durability against electroless nickel plating and electric insulation. Table 2 shows the results.

Comparative Examples 1–5

Example 1 was repeated except that the synthesized resin i was used in Comparative Examples 1 and 2, that the synthesized resins j to l were used in Comparative Examples 3 to 5, that Comparative Examples 1 and 5 used the same components as those in Example 1 as the other components, and that 5 parts of BT2070 (bisphenol A type cyanate ester compound) was additionally used in Comparative Examples 2 to 4. The thus-prepared compositions were evaluated as resists in the same manner as in Example 1. Table 1 shows the results.

Test methods and evaluation methods are as follows.

Measurement of Tg: A coating was peeled off from a board on which a composition was applied once or twice, and measured by a TMA tensile test according to the JIS C 6481 test method.

Adhesion: According to the JIS K 5400 test method, a cured coating was cross-cut at intervals of 1 mm with a cutter knife, peeled off with a Scotch tape and visually evaluated for a peeled state. The numerator denotes the number of no aborasion.

A: No peeling 100/100, B: 90–100/100, X: less than 90/100

Water absorption: A resist film having a thickness of approximately 40 µm was used as a test piece. The test piece was dried at 110° C. overnight and measured for a weight (W0). The test piece was placed in a pressure cooker at 121° C. at 2 atmospheric pressures for 1 hour, and then measured for a weight (W1). A water absorption was calculated according to the following equation.

Water absorption (%)=(W1−W0)/W0×100

Durability against soldering heat: A test piece was immersed in a solder at 260° C. for 30 seconds according to JIS C 6481, and evaluated for an appearance. For durability against soldering heat after moisture absorption, a test piece was placed in a pressure cooker for a predetermined period of time (1, 2 and 3 hours), taken out and studied for durability against soldering heat. Periods of time show hours for which the test piece was placed in the pressure cooker.

A: No change on appearance, B: Discolored, X: Peeling and swelling were found in cured coating.

Durability against electroless nickel plating: After development, a developed surface was visually observed to evaluate developability. Further, electroless nickel plating was carried out, and an adhering state of a nickel plating was observed to evaluate durability against nickel plating.

A: Nickel plating adhered excellently.

B: Nickel plating adhered excellently, but a coating was discolored.

X: Nickel plating did not adhered (remaining resin was present).

Evaluation of electric insulation: A resist ink was applied to a comb-shaped pattern according to IPC-TM-650 No. 2.6.3 (trade name: CCLHL830, copper-clad laminate, supplied by Mitsubishi Gas Chemical Co., Inc.) to prepare a test piece. The test piece was treated at 85° C. at 85% RH for 500 hours, then left in an atmosphere at 25° C. at 60% RH for 10 minutes and measured for an insulation resistance.

TABLE 1

|  | Example |  |  |  |  |  |  |  | Comparative Example |  |  |  |  |
|---|---|---|---|---|---|---|---|---|---|---|---|---|---|
|  | 1 | 2 | 3 | 4 | 5 | 6 | 7 | 8 | 1 | 2 | 3 | 4 | 5 |
| Resin | a | b | c | d | e | f | g | h | i | i | j | k | l |
| (part) | 50 | 50 | 50 | 50 | 50 | 50 | 50 | 50 | 50 | 50 | 50 | 50 | 50 |
| BT2070 |  |  |  |  |  |  |  |  |  | 5 | 5 | 5 |  |
| TGIC | 15 | 15 | 15 | 15 | 15 | 15 | 15 | 15 | 15 | 15 | 15 | 15 | 15 |
| IRC651 | 5 | 5 | 5 | 5 | 5 | 5 | 5 | 5 | 5 | 5 | 5 | 5 | 5 |
| BYK357 | 1 | 1 | 1 | 1 | 1 | 1 | 1 | 1 | 1 | 1 | 1 | 1 | 1 |
| BYK054 | 1 | 1 | 1 | 1 | 1 | 1 | 1 | 1 | 1 | 1 | 1 | 1 | 1 |
| FCG | 1 | 1 | 1 | 1 | 1 | 1 | 1 | 1 | 1 | 1 | 1 | 1 | 1 |
| Talc | 20 | 20 | 20 | 20 | 20 | 20 | 20 | 20 | 20 | 20 | 20 | 20 | 20 |
| Barium sulfate | 10 | 10 | 10 | 10 | 10 | 10 | 10 | 10 | 10 | 10 | 10 | 10 | 10 |

BT2070: Bisphenol A type cyanate ester compound
TGIC: Triglycidyl isocyanurate
IRC 651: Irgacure 651, Photopolymerization initiator, supplied by Ciba Geigy
BYK 357, BYK 054: Antifoamer and surface smoothing agent, supplied by BYK Chemie
FCG: phthalocyanine Green, supplied by Sanyo Shikiso As described above, the present invention provides a photosensitive resin composition containing an epoxy acrylate that is modified by a cyanate ester compound and further modified with an acid anhydride, and the photosensitive resin composition has excellent developability, has high heat resistance and particularly has excellent heat resistance and reliability on electric insulation under moisture absorption lasting for a long period of time.

What is claimed is:

1. A photosensitive resin (II) obtainable by a process comprising:
(i) reacting a biphenyl epoxy acrylate (a) of the formula (1)

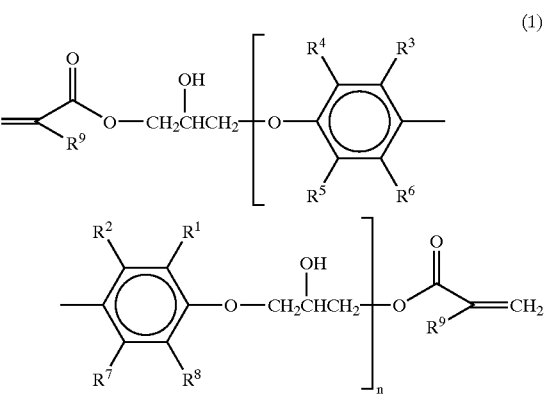

wherein each of $R^1$ to $R^9$ is a hydrogen atom or methyl with the proviso that, of $R^1$ to $R^8$, each of $R^2$, $R^3$, $R^6$ and $R^7$ is a hydrogen atom and the others are methyl or that, of $R^1$ to $R^8$, each of $R^3$ and $R^7$ is a hydrogen atom and the others are methyl, and n is an integer of 1 or more, with a cyanate ester compound (b) to obtain a reaction product (I); and
(ii) reacting the reaction product (I) with a polybasic acid anhydride (c).

2. The photosensitive resin (II) according to claim 1, wherein the cyanate ester compound (b) is an aromatic organic compound having at least 2 but not more than 5 cyanate groups per molecule, and the cyanate groups bond directly to an aromatic ring.

3. The photosensitive resin (II) according to claim 1, wherein the cyanate ester compound (b) is a monomer or a prepolymer of polyfunctional cyanate ester compound.

TABLE 2

|  |  | Example |  |  |  |  |  |  |  | Comparative Example |  |  |  |  |
|---|---|---|---|---|---|---|---|---|---|---|---|---|---|---|
|  |  | 1 | 2 | 3 | 4 | 5 | 6 | 7 | 8 | 1 | 2 | 3 | 4 | 5 |
| Tg | (° C.) | 136 | 133 | 135 | 130 | 135 | 132 | 137 | 136 | 105 | 130 | 150 | 125 | 136 |
| Adhesion |  | A | A | A | A | A | A | A | A | A | A | A | A | A |
| Water absorption | (%) | 0.27 | 0.32 | 0.35 | 0.41 | 0.24 | 0.30 | 0.32 | 0.33 | 3.05 | 3.20 | 0.65 | 1.84 | 1.65 |
| Druability against soldering heat | Initial | A | A | A | A | A | A | A | A | A | A | A | A | A |
|  | After 1 h* | A | A | A | A | A | A | A | A | X | X | A | A | A |
|  | After 2 h* | A | A | A | A | A | A | A | A | X | X | A | B | B |
|  | After 3 h* | A | A | A | A | A | A | A | A | X | X | B | X | X |
| DAENP** |  | A | A | A | A | A | A | A | A | A | X | X | X | A |
| Electric insulation ($\Omega \times 10^{12}$) | Initial | 16 | 14 | 16 | 15 | 16 | 16 | 15 | 16 | 10 | 14 | 15 | 15 | 15 |
|  | after ma*** | 0.1 | 0.2 | 0.3 | 0.5 | 0.2 | 0.3 | 0.3 | 0.3 | 0.001 | 0.3 | 0.3 | 0.2 | 0.1 |

*1 h = 1 hour, 2 h = 2 hours, 3 h = 3 hours
**DAENP: Durability against electroless nickel plating
***ma = moisture absorption 4. The photosensitive resin (II) according to claim 1, wherein the polybasic acid anhydride (c) contains at least pyromellitic acid anhydride.

5. The photosensitive resin composition (III) comprising the photosensitive resin (II) recited in claim 1 and an epoxy resin (d).

6. The photosensitive resin composition (III) according to claim 5, wherein the amount of the epoxy resin (d) is 1 to 1.5 equivalent weights per equivalent weight of carboxylic acids contained in the photosensitive resin (II).

7. The photosensitive resin composition (III) according to claim 5, wherein the amount of the epoxy resin (d) is 50 parts by weight or less per 100 parts by weight of the photosensitive resin composition (III).

8. A photosensitive resin composition (III) comprising the photosensitive resin II obtainable by a process comprising:
(i) reacting a biphenyl epoxy acrylate (a) of the formula (1)

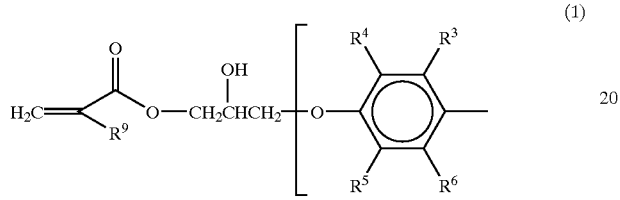

(1)

-continued

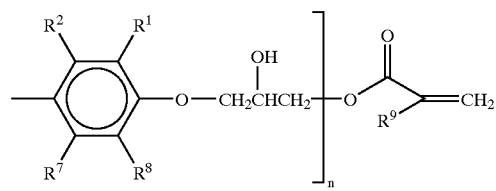

wherein each of $R^1$ to $R^9$ is a hydrogen atom or methyl, and n is an integer of 1 or more, with a cyanate ester compound (b) to obtain a reaction product (I); and (ii) reacting the reaction product (I) with a polybasic acid anhydride (c)
and an epoxy resin (d), wherein the amount of the epoxy resin (d) is 1 to 1.5 equivalent weights per equivalent weight of carboxylic acids contained in the photosensitive resin (II).

* * * * *